(12) United States Patent
Mocanu et al.

(10) Patent No.: US 12,095,119 B2
(45) Date of Patent: Sep. 17, 2024

(54) ERROR SIGNALING ON A SEPARATE OUTPUT PIN OF A BATTERY MONITORING SYSTEM

(71) Applicant: Infineon Technologies AG, Neubiberg (DE)

(72) Inventors: Dan-Alexandru Mocanu, Bucharest (RO); Bogdan Bumbacea, Bucharest (RO); Ilie-Ionut Cristea, Turnu Magurele (RO); Radu Mihaescu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 163 days.

(21) Appl. No.: 17/697,143

(22) Filed: Mar. 17, 2022

(65) Prior Publication Data

US 2023/0299438 A1 Sep. 21, 2023

(51) Int. Cl.
*H01M 50/578* (2021.01)
*G01R 31/396* (2019.01)
*G06F 13/42* (2006.01)

(52) U.S. Cl.
CPC ........ *H01M 50/578* (2021.01); *G01R 31/396* (2019.01); *G06F 13/4282* (2013.01)

(58) Field of Classification Search
None
See application file for complete search history.

(56) References Cited

U.S. PATENT DOCUMENTS

| | | | |
|---|---|---|---|
| 6,625,688 B1 | 9/2003 | Fruehling et al. | |
| 2013/0067256 A1* | 3/2013 | Shiraishi | H01M 10/48 713/320 |
| 2015/0054467 A1* | 2/2015 | Takano | H02J 7/0047 320/136 |
| 2017/0082693 A1* | 3/2017 | Leidich | G01R 31/3835 |
| 2021/0012853 A1 | 1/2021 | Murozuka | |
| 2021/0111443 A1 | 4/2021 | Wang et al. | |

(Continued)

FOREIGN PATENT DOCUMENTS

| CN | 109116249 B | 7/2020 |
|---|---|---|
| CN | 212208007 U | 12/2020 |

(Continued)

*Primary Examiner* — Jas A Sanghera
(74) *Attorney, Agent, or Firm* — Harrity & Harrity, LLP

(57) ABSTRACT

A sensor device includes a pressure sensor configured to measure an internal air pressure and generate a sensor signal representative of the measured internal air pressure; a serial peripheral interface (SPI) configured to receive SPI commands; a wake-up terminal configured to output fault signals; and a processing circuit. The processing circuit is configurable between a normal running mode and a low power monitoring (LPM) mode. In LPM mode, the processing circuit is configured to alternate between a sampling phase during which the processing circuit evaluates the sensor signal and a powered-down phase during which the processing circuit is in a low power state. The processing circuit is configured to monitor for at least one SPI communication fault corresponding to information received on the SPI, generate a communication fault signal in response to detecting the at least one SPI communication fault, and output the communication fault signal from the wake-up terminal.

26 Claims, 2 Drawing Sheets

(56) References Cited

U.S. PATENT DOCUMENTS

2021/0209003 A1    7/2021  Kowkutla et al.
2022/0262229 A1*   8/2022  Cho .................... G08B 21/185

FOREIGN PATENT DOCUMENTS

| CN | 113619389 A | 11/2021 |
|----|-------------|---------|
| EP | 3534261 B1 | 11/2020 |
| KR | 20180087766 A | 8/2018 |
| WO | 9516200 A1 | 6/1995 |

* cited by examiner

ERROR SIGNALING ON A SEPARATE OUTPUT PIN OF A BATTERY MONITORING SYSTEM

BACKGROUND

The Serial Peripheral Interface (SPI) is a synchronous serial communication interface specification used for short-distance communication, primarily in embedded systems. In particular, it is an interface bus commonly used to send data between microcontrollers and peripherals (e.g., peripheral integrated circuits (ICs)) such as shift registers, sensors, analog-to-digital converters (ADCs), digital-to-analog converters (DACs), and memory devices. It uses separate clock and data lines, along with a select line used to select which peripheral device to communicate with. The microcontroller is typically referred to as the master device or IC and the peripherals are typically referred to as slave devices or ICs.

In sensors with a low power monitoring (LPM) mode the internal supply is periodically cut in order to reduce current consumption and to save power. To initiate the low power mode on the sensor, the microcontroller transmits an "enter LPM mode" SPI command, with no further SPI communication being initiated until the intended wake-up of the system. In this case the microcontroller does not receive any confirmation of the status of the SPI communication and the current operation mode of the sensor is ambiguous to the microcontroller. If the "enter LPM mode" SPI command is not received correctly by the sensor, the sensor will not enter LPM mode even though the microcontroller assumes that it has. Thus, the microcontroller assumes the sensor is in LPM mode and does not send any new SPI commands. Meanwhile, the sensor remains in full communication mode (e.g., half-duplex or full-duplex mode) and has not entered low power mode due to the communication error. During full communication mode the sensor waits for a new SPI command to perform some commanded action instead of being in LPM mode. Thus, a type of deadlock between the microcontroller and the sensor occurs as a result of the communication error that occurs during the transmission of the "enter LPM mode" SPI command.

Additionally, for a full-duplex communication protocol (e.g., 4-wire SPI), if error signaling of communication errors happens on the same SPI interface, there will be a delay of one SPI communication frame before the communication error can be transmitted by the slave. In this case, if there is a big gap between the SIP communication frames (e.g., if the system issues a low power monitoring/power down command to the sensor) there is ambiguity regarding the correct reception and interpretation of the command. This ambiguity is in need of being resolved.

In addition, voltage regulators occupy a significant percentage of the chip area in sensor and the failure of the voltage regulator in LPM mode should be detected. A failure in the voltage regulator will prevent the digital logic of the sensor from waking up and signaling a fail to the microcontroller. Thus, a failure here cannot be detected in conventional sensors that enter LPM mode and will be left out.

Accordingly, a sensor configurable with an LPM mode that can signal both communication errors and voltage regulator errors may be desirable.

SUMMARY

One or more embodiments provide a battery monitoring system that includes a sensor device. The sensor device includes a pressure sensor configured to measure an internal air pressure within a battery enclosure and generate a sensor signal representative of the measured internal air pressure; a first serial peripheral interface (SPI) configured to receive SPI commands; a wake-up terminal configured to output fault signals; and a first processing circuit coupled to the pressure sensor, the first SPI interface, and the wake-up terminal. The first processing circuit is configurable between a normal running mode and a low power monitoring (LPM) mode, wherein, in the LPM mode, the first processing circuit is configured to alternate between a sampling phase during which the first processing circuit evaluates the sensor signal and a powered-down phase during which the first processing circuit is in a low power state. The first processing circuit is configured to monitor for at least one SPI communication fault corresponding to information received on the first SPI, generate a communication fault signal in response to detecting the at least one SPI communication fault, and output the communication fault signal from the wake-up terminal.

One or more embodiments provide a serial peripheral interface (SPI) communication system including a sensor device and a microcontroller. The sensor device includes a sensor configured to measure a physical quantity and generate a sensor signal; a first serial peripheral interface (SPI) configured to receive SPI commands; a wake-up terminal configured to output fault signals; and a first processing circuit coupled to the sensor devi, the first SPI interface, and the wake-up terminal, wherein the first processing circuit is configurable between a normal running mode and a low power monitoring (LPM) mode, wherein, in the LPM mode, the first processing circuit is configured to alternate between a sampling phase during which the first processing circuit evaluates the sensor signal and a powered-down phase during which the first processing circuit is in a low power state, and wherein the first processing circuit is configured to monitor for at least one SPI communication fault corresponding to information received on the first SPI, generate a communication fault signal in response to detecting the at least one SPI communication fault, and output the communication fault signal from the wake-up terminal. The microcontroller includes a second SPI interface coupled to the first SPI interface of the sensor device and configured to transmit the SPI commands thereto; a digital input terminal coupled to the wake-up terminal of the sensor device for receiving the fault signals; and a second processing circuit coupled to the second SPI interface and the digital input terminal, wherein the second processing circuit is configurable between a normal running mode and a low power mode, wherein, the second processing circuit is configured to transmit an enter LPM mode SPI command via the second SPI interface to the sensor device to set the sensor device in the LPM mode, and wherein, in response to receiving the communication fault signal via the digital input terminal, the second processing circuit is configured to exit the low power mode and enter the normal running mode.

One or more embodiments provide a sensor device including: a sensor configured to measure a physical quantity and generate a sensor signal representative of the measured physical quantity; a voltage regulator configured to convert an external power supply into an internal power supply having a powered-up supply value or a powered-down supply value; an oscillator configured to generate a clock signal; a power cycle circuit configured to toggle a powered state of the voltage regulator between a powered-up state and a powered-down state based on the clock signal, wherein the voltage regulator is configured to generate the powered-up supply value during the powered-up state and generate the powered-down supply value during the powered-down state; a voltage monitoring circuit configured to compare the internal power supply to a threshold value and toggle a reset signal between a first signal level when the internal power supply is equal to or greater than the threshold value and a second signal level when the internal power supply is less than the threshold value; and a flip-flop including a data input terminal configured to receive the reset signal and a fault output terminal, wherein the flip-flop is configured to generate a fault signal at the fault output terminal when the voltage regulator is configured in the powered-up state and when the data input receives the reset signal having the second signal level.

BRIEF DESCRIPTION OF THE DRAWINGS

Embodiments are described herein making reference to the appended drawings.

DETAILED DESCRIPTION

Figure 1A:
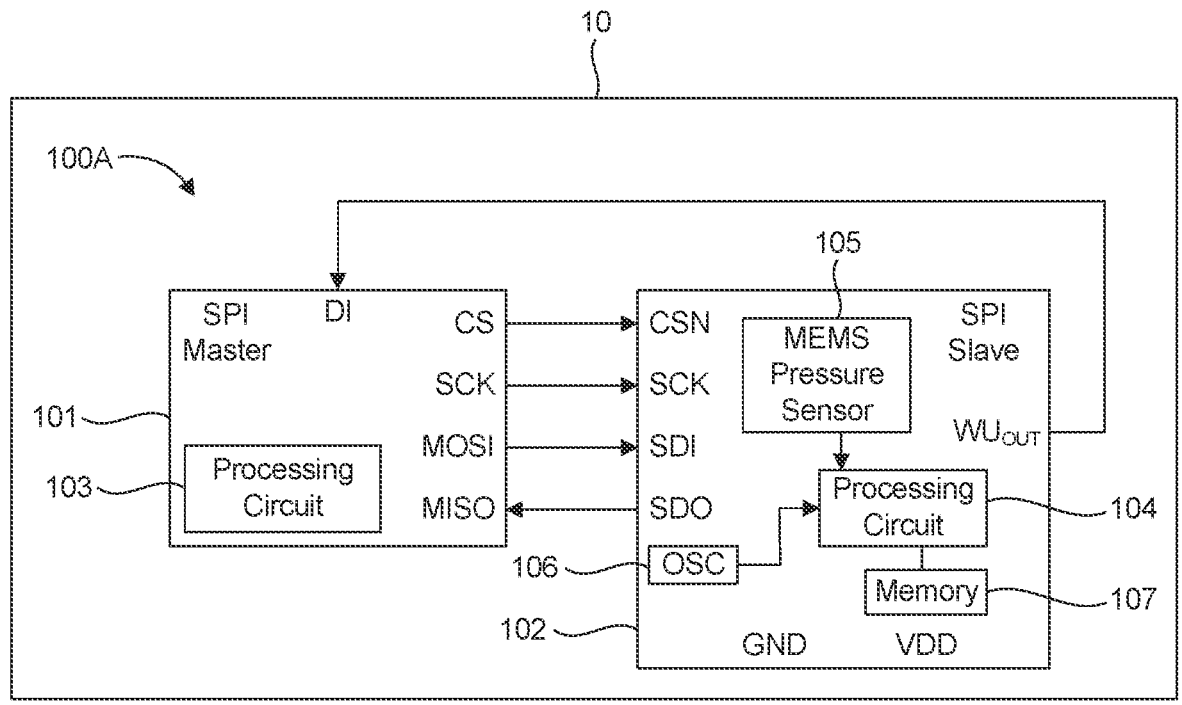
FIG. 1A is a schematic block diagram of a full-duplex Serial Peripheral Interface (SPI) communication system according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation. For example, lateral, vertical, and overlapping spatial or positional relationships may be described in reference to another element or feature, without being limited to a specific orientation of the device as a whole.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

Embodiments relate to sensors and sensor systems, and to obtaining information about sensors and sensor systems. A sensor may refer to a component which converts a physical quantity to be measured to an electric signal, for example, a current signal or a voltage signal. The physical quantity may for example comprise a magnetic field, an electric field, a pressure, an acceleration, a temperature, a force, a current, or a voltage, but is not limited thereto.

A sensor circuit may be referred to as a signal processing circuit and/or a signal conditioning circuit that receives the signal (i.e., sensor signal) from the sensor in the form of raw measurement data. The sensor circuit may include an analog-to-digital converter (ADC) that converts the analog signal from the sensor to a digital signal. The sensor circuit may also include a digital signal processor (DSP) that performs some processing on the digital signal (e.g., to prepare sensor information for evaluation or transmission). Therefore, the sensor package comprises a circuit which conditions and amplifies the small signal of the sensor via signal processing and/or conditioning.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, downsampling, biasing, range matching, isolation and any other processes required to make a sensor output suitable for processing after conditioning.

According to one or more embodiments, a pressure sensor and a sensor circuit are both accommodated (i.e., integrated) in the same chip package (e.g., a plastic encapsulated package, such as leaded package or leadless package, or a surface mounted device (SMD)-package). This chip package is also referred to as sensor package. The sensor package may be combined with other components to form a sensor module, sensor device, or the like.

A sensor device, as used herein, may refer to a device which includes a sensor and sensor circuit as described above. A sensor device may be integrated on a single semiconductor die (e.g., silicon die or chip), although, in other embodiments, a plurality of dies may be used for implementing a sensor device. Thus, the sensor and the sensor circuit are disposed on either the same semiconductor die or on multiple dies in the same package. For example, the sensor might be on one die and the sensor circuit on another die such that they are electrically connected to each other within the package. In this case, the dies may be comprised of the same or different semiconductor materials, such as GaAs and Si, or the sensor might be sputtered to a ceramic or glass platelet, which is not a semiconductor.

As a Serial Peripheral Interface (SPI) is a full-duplex device, it will have separate pins for input data and output data. A half-duplex interface is similar to the true SPI, but one pin is used for I/O (input and output). To configured the host adapter, insert a resistor between the MOSI signal and the MISO signal, and then connect the MISO line to the data line of the SPI slave device.

FIG. 1A is a schematic block diagram of a Serial Peripheral Interface (SPI) communication system 100A according to one or more embodiments. In particular, the communication system 100A is a battery monitoring system configured to monitor a status of a battery 10. For example, the communication system 100A can be arranged inside an enclosure of a battery 10 in the electric car to detect thermal runaway. This can be detected as a jump in the pressure inside the enclosure.

The SPI communication system 100A includes an SPI master device 101, such as a microcontroller, and a SPI slave device 102, such as a peripheral device. In this example, the SPI slave device 102 is a sensor device that includes a pressure sensor 105. Thus, the SPI slave device 102 may also be referred to as a sensor device 102. The SPI slave device 102 can be any integrated circuit (i.e., chip) comprising a data register and capable performing data operations (e.g., read and write operations) from/to the data register at the control of the SPI master device 101. Here, a read operation is a data transmission originating at the SPI slave device 102 and terminating at the SPI master device 101 and a write operation is a data transmission originating at the SPI master device 101 and terminating at the SPI slave device 102. The master and slave devices each include at least one processor (i.e., a processing circuit) for performing their data operations.

For example, the processing circuit of the SPI slave device 102 may include a decoder for decoding SPI communications from the SPI master devise 101. The processing circuit of the SPI slave device 102 may also detect falling and rising edges of a chip select signal and count the number of clock cycles therebetween. Additionally, the processing circuitry 104 of the slave device 102 is configured to process sensor data received from the pressure sensor 105, perform computations thereon, and generate data signals based on the processed sensor data.

The master and slave devices both include an SPI clock (SCK) terminal or pin connected by a clock signal line. The device that generates the clock signal SCK is called the master. Data transmitted between the master and the slave is synchronized to the clock generated by the master. During SPI communication, the data is simultaneously transmitted (shifted out serially onto the MOST/SDI bus) and received (the data on the bus (MISO/SDO) is sampled or read in). The serial clock edge synchronizes the shifting and sampling of the data. The SPI interface provides the user with flexibility to select the rising or falling edge of the clock to sample and/or shift the data. Each clock cycle represents a bit.

For example, data present at Serial Data Input (SDI) may be latched on the rising edge of the clock signal SCK and data on Serial Data Out (SDO) may be shifted out at the falling edge of clock signal SCK. The SDI is a data input terminal of the slave device 102 and is connected to the master out, slave in (MOSI) terminal of the master device 101 by a data line. The master device 101 transmits information, including control information and data, to the slave device 102 via its MOSI terminal. The SDI terminal is used to transfer data serially into the slave device. It receives the data to be written. The SDO is a data output terminal of the slave device 102 and is connected to the master in, slave out (MISO) terminal of the master device 101 by a data line. The master device 101 receives (reads) information, from the slave device 102 via its MISO terminal. The SDO terminal is used to transfer data serially out of the slave device. It transmits the data to be read.

Chip Select Not (CSN): when this input signal is High, the device is not selected and Serial Data Output (SDO) is set to a high impedance. Driving this input Low enables the communication. The communication must start and stop on a Low level of Serial Clock (SCK).

The master and slave devices both include corresponding chip select terminals connected by a select signal line. On the master device side, its chip select (CS) terminal is responsible for outputting a chip select signal. The chip select terminal of the slave device is a chip select not (CSN) terminal, meaning that the chip select signal is an active low signal. The chip select signal is transmitted from the master device 101 and is used to select and/or enable the slave device 102 for SPI communication. The chip select signal is low when communication with the slave device 102 is enabled and is pulled high to disconnect the slave device 102 from the SPI bus, thereby disabling communication with the slave device 102. More particularly, when the chip select signal is pulled high, the SDO terminal is placed in high impedance. Driving this input low enables the communication. Thus, the master device 101 must send a logic 0 on this CS signal to select the slave device 102.

An SPI communication frame (i.e., a CS frame) is defined by an interval during which the CS signal is low (logic 0) between two consecutive high (logic 1) signal levels. Thus, a falling edge of the CS signal from high-to-low denotes a start of a CS frame and the next edge (i.e., a rising edge) from low-to-high denotes an end of the CS frame. Each CS frame is a predetermined number of clock cycles in length corresponding to the number of bytes of the SPI buffer. For example, for an x-byte SPI buffer, each CS frame is x-bytes in length, where x is an integer greater than one. Two consecutive CS frames are separated by an idle period during which the CS signal is high (logic 1) and communication from the slave device 102 is disabled.

The master device 101 includes processing circuitry 103 that performs the functions of the master device 101 described herein for performing SPI communications, including signal generation (e.g., CS, SCK, and MOSI signals) including synchronization and control of the slave device 101, signal reception (e.g., MISO signals) and the processing thereof, data sampling in from the MISO data line, shifting data out onto the MOSI signal line, register address incrementation and tracking, register address evaluation, and processing data received from the slave device 102, and processing of fault signals received from the slave device 102 and taking action in response thereto. The processing circuitry 103 may include at least one processor and other processing circuitry configured to process, condition, compare, evaluate, encode, or decode signals and data.

Similarly, the slave device 102 includes processing circuitry 104 that performs the functions of the slave device 102 described herein for performing SPI communications, including signal generation (e.g., MISO signals), signal reception (e.g., CS, SCK, and MOSI signals) and the processing thereof, data sampling in from the MOSI data line, shifting data out onto the MISO data line, register address incrementation and tracking, register address evaluation, processing commands and data received from the master device 101 (e.g., entering low power monitoring (LPM) mode), processing of sensor signals, detecting faults, and communicating detected faults to the master device.

The processing circuitry 104 may include at least one processor and other processing circuitry configured to process, condition, compare, evaluate, encode, or decode signals and data. For example, the processing circuitry 104 may signal processing chain including an ADC configured to acquire samples from the sensor 105 at each clock cycle, a downsampler configured to perform down sampling on the digital signal (e.g., using a digital lowpass filter to remove high-frequency signal components and a decimator that decimates the filtered signal by an integer factor of X so that only the Xth sample is provided to a processor for evaluation), additional filters as needed, and a processor at the end of the signal processing chain that performs evaluation on a digital sensor value. Comparators may also be used for performing a comparison to a threshold value.

Figure 1B:
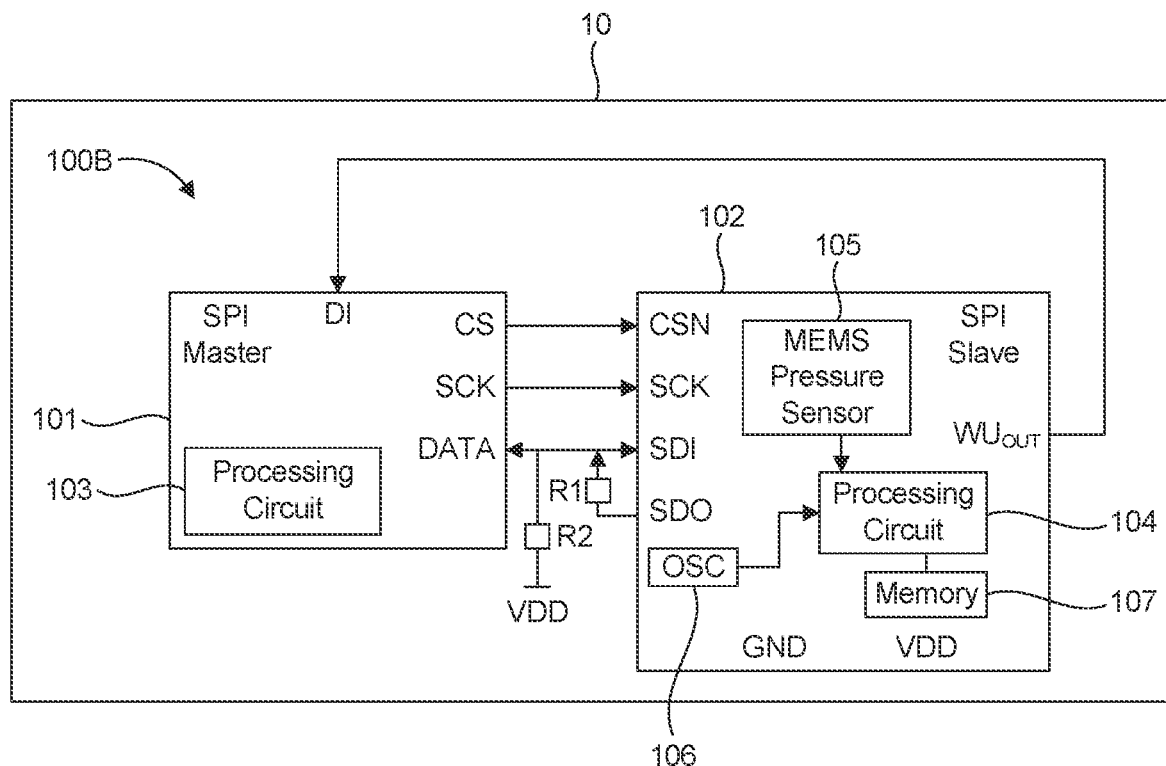
FIG. 1B is a schematic block diagram of a half-duplex SPI communication system according to one or more embodiments.

The SPI shown in FIG. 1A is a full-duplex interface; both master and slave can send data at the same time via the MOSI and MISO data lines respectively. Here, separate pins are present for input data and output data. It is also noted that ground GND and VDD pins are also shown for the slave device 102. In full communication mode (i.e., duplex mode), a command is received via SDI terminal of the SPI interface and the response for the current command is provided on the SDO terminal during the next command (i.e., during the next SPI communication frame), including diagnosis information regarding the sanity or validity of the SPI communication FIG. 1B is a schematic block diagram of a SP) communication system 100B according to one or more embodiments. The communication system 100B is similar to that of communication system 100A, except its SPI interface is a half-duplex interface. This means the master device 101 includes one data terminal DATA for data input and output and the SDI and SDO terminals of the slave device 102 share this DATA terminal for communication. As a result, only the master or the slave can transmit at any given communication frame via time multiplexing. To configure the communication system 100B in half-duplex, a resistor R1 is connected to and between the data signal line and the SDO terminal. Additionally, another resistor R2 is connected to and between the data signal line and a high supply potential VDD. This represents one example of a half-duplex configuration.

The communication system 100B is also a battery monitoring system that is arranged inside an enclosure of a battery 10 for monitoring a status thereof. Accordingly, aside from one system being full-duplex and the other system being half-duplex, it can be assumed that both systems incorporate similar features. Thus, unless explicitly stated otherwise, features of the example embodiments described herein apply to both communication systems.

The sensor device 102 is configured to monitor the battery 10 throughout the lifetime of the battery 10. As a result, the average current consumption of the microcontroller 101 and sensor device 102 needs to be low. Both communication systems 100A and 100B are configurable in LPM mode. When this occurs, both the master device 101 and the sensor device 102 enter into a low power state to reduce power consumption. Before the master device 101 enters its low power mode, it sends a commend to the sensor device 102 to enter LPM mode. The microcontroller 101 wakes up from low power mode to communicate with the sensor device 102 via the SPI interface and/or to perform fault analysis in response to receiving a fault from the sensor device 102. On the other hand, LPM mode of the sensor device 102 is a pulse-width modulation (PWM) mode during which the sensor device 102 periodically wakes up to acquire a sensor measurement via the pressure sensor 105 and determine whether a battery fault exists before powering down between samples. The processing circuitry 104 also performs internal checks when it wakes up to verify that it is operating normally or whether a system fault exists. For example, the processing circuitry 104 may evaluate its own signal processing path for detecting a fault present on the signal processing path.

As a self wake-up system, the sensor device 102 includes a low power oscillator (OSC) 106 used to wake-up the chip at regular intervals. The LPM mode includes a sampling phase triggered based on the clock signal generated by the low power oscillator 106, during which a sensor measurement is acquired and analyzed, and a powered-down phase during which the sensor device 102 is in a low power state. the power down intervals are typically much longer than the sampling intervals according to a PWM duty cycle to converse power. The processing circuitry 104 may wake up every N clock cycles and define a sampling period by M clock cycles, where N and M are integers with N>M.

In LPM mode, the sensor device 102 periodically wakes up (powers up) to monitor the pressure differential inside the enclosure and alerts the microcontroller 101 via a dedicated wakeup out (WUout) pin if the pressure differential exceeds an expected result. Thermal runaway in the battery enclosure result in a sharp increase in ambient pressure within the battery enclosure that can be detected. The fault signal is sent via the WUout pin to wake up the microcontroller 101 to perform fault analysis and calculations. The microcontroller 101 receives the fault signal at a Digital Input (DI) terminal, wakes up from low power mode, identifies the type of fault being signaled, and performs fault analysis. Upon waking up, the microcontroller 101 may wake up sensor device 102 by driving the chip select signal low and may request additional data from the slave device via the SPI interface (e.g., via the data in SDI and data out SDO signal lines).

The DI terminal is part of a digital communication interface that is separate from the SPI. Likewise, the WUout terminal is part of a digital communication interface that is separate from the SPI. The WUout terminal is used to communicate all errors and faults detected by the sensor device 102. That is the SDO terminal is not used to communicate (e.g., indicate or flag) errors and faults, but may be used to transmit diagnostic information related to a detected fault at the command of the microcontroller 101 (e.g., the microcontroller sends an SPI command via its MOSI terminal instructing the sensor device 102 to transmit diagnostic information).

According to the disclosed embodiments, the WUout terminal is used in both LPM mode and in full communication mode (i.e., normal running mode). In LPM mode, the processing circuitry 104 uses the WUout terminal to transmit various types of fault signals to the microcontroller 101 to alert the microcontroller 101 of any safety-related malfunction of the sensor device 102 detected while in LPM mode.

To initiate the LPM mode on the sensor device 102, the microcontroller 101 transmits an "Enter LPM mode" SPI command on the SDI data line, with no further SPI communication being initiated until the intended wake-up of the system. In this case the microcontroller 101 does not receive any confirmation of the status of the SPI communication (i.e., of the "Enter LPM mode" SPI command) and the current operation mode of the sensor device 102 is ambiguous to the microcontroller 101. In other words, the microcontroller 101 assumes that the "Enter LPM mode" SPI command was received correctly and that the sensor device 102 is set into its LPM mode. However, a deadlock between the microcontroller 101 and the sensor device 102 is reached if a communication error occurred during the transmission of the "Enter LPM mode" SPI command. In this case, the sensor device 102 remains in full communication mode (i.e., normal running mode or full power mode), during which it waits for additional commands that never come. Meanwhile, power is being consumed unnecessarily while the sensor device is in normal running mode.

To avoid mode ambiguity and situations where the command was incorrectly received and/or incorrectly decoded by the sensor device 102, the sensor device 102 uses the WUout pin during full communication mode to signal all communication errors. If in a low power mode, the microcontroller 101 wakes up in response to any fault signal received via its DI terminal to perform a fault analysis. The microcontroller 101 may also decide to resend the recently transmitted "Enter LPM mode" SPI command.

One type of communication fault is referred to as a clock cycle fault, which is a communication protocol error. As noted above, an SPI communication frame (i.e., a CS frame) is defined by an interval during which the CS signal is low (logic 0) between two consecutive high (logic 1) signal levels. Additionally, each CS frame is a predetermined number of clock cycles in length corresponding to the number of bytes of the SPI buffer. Two consecutive CS frames are separated by an idle period during which the CS signal is high (logic 1) and communication from the slave device 102 is disabled. The processing circuitry 104 is configured to monitor (i.e., count) the number of clock cycles of the clock signal SCK between a falling edge of the CS signal (i.e., a start of a CS frame) and the next rising edge of the CS signal (i.e., an end of the CS frame). The processing circuitry 104 then compares the number of counted clock cycles with the predetermined number of clock cycles expected for a frame length. If the number of counted clock cycles deviates from the predetermined number of expected clock cycles, the processing circuitry 104 detects a communication error, generates a clock cycle fault signal, and transmits the clock cycle fault signal to the microcontroller 101 via the WUout terminal. If the number of counted clock cycles matches the predetermined number of expected clock cycles, no clock cycle fault is detected.

Another type of communication fault is referred to as an invalid command fault. The memory 107 of the sensor device 102, accessible to the processing circuitry, stores a catalog of valid commands. Upon receiving a command from the microcontroller 101, the processing circuitry 104 is configured to access the catalog of valid commands and compare the received command to those in the catalog. If a match is found within the catalog, not invalid command fault is detected. On the other hand, if the processing circuitry 104 does not find a match within the catalog, it determines that the received command is invalid and signals an invalid command fault to the microcontroller 101 via the WUout terminal.

Thus, commands that have been incorrectly received and/or decoded by the sensor device 102 can be detected by one of these two communication faults and signaled by an output at the WUout terminal. This informs the microcontroller 101 that the previous communication attempt was not completed successfully. Although the processing circuitry 104 is configured to signal any communication fault via the WUout terminal, in addition to detected pressure abnormalities and internal faults, the fault signaling is particularly important during full communication mode (i.e., normal running mode or full power mode). This is because if an "Enter LPM mode" SPI command is incorrectly received or incorrectly decoded, the sensor device 102 remains in full communication mode. Thus, if LPM was the intended command, a deadlock between the microcontroller 101 and the sensor device 102 can be avoided or resolved quickly. If the microcontroller 101 is in a low power mode as a result of transmitting the "Enter LPM mode" SPI command, the microcontroller 101 will be woken up by the fault signaling, ending any deadlock.

Figure 2:
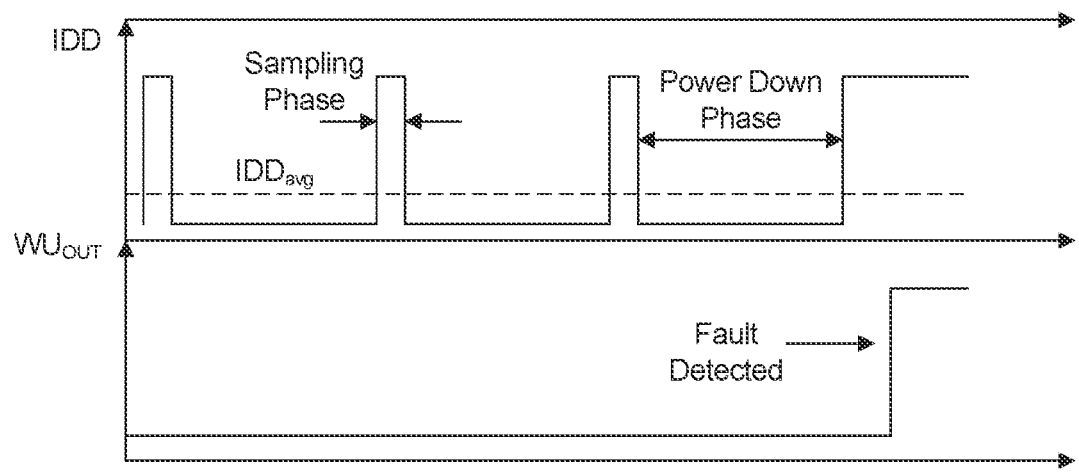
FIG. 2 illustrates signal diagrams of a current consumption of a sensor device and a fault signal according to one or more embodiment.

FIG. 2 illustrates signal diagrams of a current consumption of the sensor device and a fault signal according to one or more embodiments. Specifically, the top waveform is a current consumption of current IDD by the sensor device 102 while configured in LPM mode. The waveform of the current consumption has a PWM duty cycle corresponding to the sampling phase and the power down phase of the sensor device 102 in LPM mode. The current consumption increases to sample the sensor signal and evaluate the measured pressure. The current consumption decreases between sampling phases to reduce the average current consumption IDDavg of the sensor device 102.

Additionally, the output signal of the WUout terminal remains low in the absence of a fault, but is toggled high when a fault is detected to notify the microcontroller 101 of the fault. The sensor device 102 may also exit the LPM mode when the output signal of the WUout terminal is toggled high.

While in LPM mode, the internal supply of the sensor device 102 is periodically cut via voltage regulator in order to save power. Since the voltage regulator occupies a significant percentage of the chip area in sensor device 102, the operability of the voltage regulator itself should be monitored. A failure in the voltage regulator will prevent the digital processing circuitry or an ADC from waking up, reading the sensor signal, and signaling a fail to the microcontroller 101 via WUout. Thus, if a failure of the voltage regulator exists, it should be detected. This additional fault can also be signaled by the WUout terminal.

Figure 3:
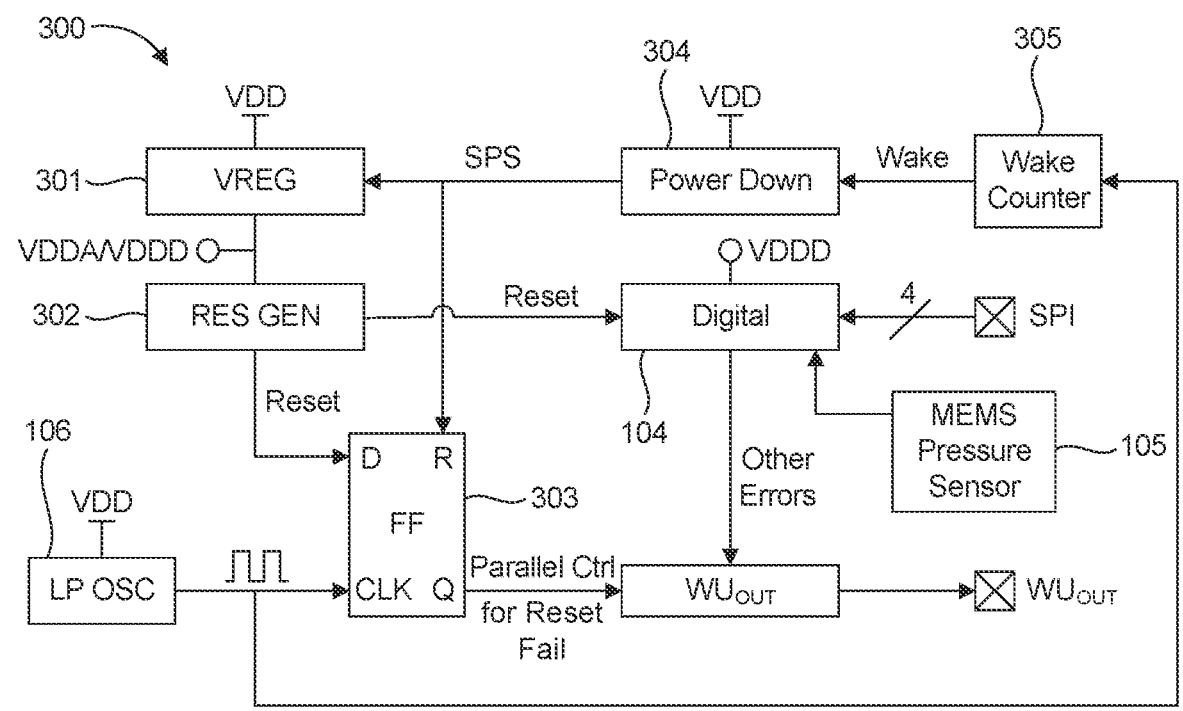
FIG. 3 is a schematic block diagram of a power circuit of a sensor device according to one of more embodiments.

FIG. 3 is a schematic block diagram of a power circuit 300 of the sensor device 102 according to one of more embodiments. The power circuit 300 is coupled to an external power supply VDD. A voltage regulator 301 generates the internal voltage supplies from the external power supply VDD. It converts the external power supply into an internal power supply having a powered-up supply value during the powered-up state or a powered-down supply value during a powered-down state.

A reset generator 302 generates a reset signal when the one of the internal supplies VDDA or VDDD drops below a level lower than nominal value. Thus, the reset generator 302 is a voltage monitoring circuit. For example, VDDA is the internal analog voltage supply for analog components on the chip. In contrast, VDDD is the internal digital voltage supply for digital components on the chip. VDDD is less than or equal to VDDA. The reset generator 302 is configured to compare VDDA to a first voltage threshold and/or compare VDDD to a second voltage threshold. The comparison(s) may be performed continuously or at regular intervals based on the clock signal (e.g., at every rising signal edge) such that the reset signal accurately reflects the state of the internal supply relative to the threshold value.

If either VDDA or VDDD falls below its respective threshold, the reset generator 302 toggles the reset signal from low to high, indicating that the voltage regulator is outputting low power. This below threshold state could be normal if a lower power state is intended or could be abnormal if a powered-up state is intended. For example, the reset generator 302 may toggle the reset signal from low to high when either VDDA or VDDD falls below its respective threshold. Accordingly, the reset generator 302 toggles the reset signal between a first signal level when the internal power supply is equal to or greater than the threshold value and a second signal level when the internal power supply is less than the threshold value. The threshold value is less than the powered-up supply value and may also be less than the powered-down supply value. The threshold value may be set to be between the powered-down supply value and the powered-up supply value. The reset signal is provided both to a D-flip flop 303 and the (digital) processing circuitry 104. The reset signal is a general input to digital circuits to ensure that the digital circuits operate only when the supply is above the minimum level for which the circuit design. It is also to ensure that a starting point of the digital circuits is well defined.

The processing circuit 104 coupled to the sensor 102 for receiving the sensor signal therefrom. The processing circuit 104 is configurable in the powered-up state and the powered-down state in accordance with the powered state of the voltage regulator 301. In the powered-up state, the processing circuit 104 is configured to acquire a sample value of the sensor signal and evaluate the sensor value, as described above. In the powered-down state, the processing circuit 104 is idle.

The power circuit 300 further includes a power cycle circuit 304 that receives an internal wake signal (i.e., "wake") that controls the power down/power up cycle. The power cycle circuit 304 disables the generation of the internal supplies VDDA and VDDD corresponding to a programmed PWM off duration. The output SPS (i.e., power state signal SPS) of the power cycle circuit 304 indicates whether the power circuit is in a powered-up state (SPS=0) or in a powered-down state (SPS=1). In this way, the power cycle circuit 304 is configured to toggle a powered state of the voltage regulator 301 between a powered-up state and a powered-down state.

Terminal Q of the D flip-flop 303 is the Output pin. It outputs which value the flop is currently remembering or storing. Terminal D of the D flip-flop 303 is the data input pin. This is where the flip-flop gets its information from. Here, the D flip-flop 303 samples the state of the reset signal at its data input D while the chip is not in powered-down state (i.e., when SPS=0). Terminal R an active high reset. When the Reset pin receives a high signal (i.e., when SPS=1), it resets the flop to store a 0, or a low value, which is output at the output pin Q. Naturally, the Terminal R could be an active low reset and meaning of the signal levels of signal SPS could be reversed in that case. In a power down state (i.e., SPS=1) or when the chip wakes up normally (i.e., reset=0), the Q output pin remains at 0.

In general, the D flip-flop 303 includes a data input terminal configured to receive the reset signal and a fault output terminal, wherein the flip-flop is configured to generate a fault signal at the fault output terminal when the voltage regulator 301 is configured in the powered-up state via the power state signal SPS and when the data input receives the reset signal having the second signal level indicating that the internal power supply is less than the is less than the threshold value. The D flip-flop 303 incudes a reset terminal configured to receive the power state signal SPS. The D flip-flop 303 is configured to generate a no-fault signal at the fault output terminal when the power state signal SPS indicates the powered-down state or the reset signal is set at the first signal level indicating that the internal power supply is equal to or greater than the threshold value.

Specifically, the D flip-flop 303 includes a clock terminal CLK that is connected to the low power oscillator 106. The D flip-flop 303 is configured to sample the reset signal received at the data input terminal on a signal edge of the clock signal. The low power oscillator 106 is used to wake-up the chip at regular intervals. In other words, the clock signal output by the low power oscillator 106 is used as a basis for the PWM cycle of sampling and power down phases. Internal PWM logic, such as a wake counter 305, may use the clock signal to generate the wake signal at regular intervals such that the sampling and power down phases are accurately defined. The regular interval may be defined by a predetermined number of clock cycles and the wake counter 305 may be configured to count the clock pulses/cycles and trigger the wake signal every time the predetermined number of clock cycles is met. The wake signal is used to trigger the power cycle circuit 304 to toggle the signal SPS low (SPS=0) for a predetermined duration for configuring the voltage regulator 301 in the powered-up state while the power state signal SPS is low. In other words, the wake signal is a PWM control signal generated by the wake counter 305.

The clock signal is provided to the clock terminal CLK. When a new clock pulse comes in (e.g., a rising clock edge), the D flip-flop 303 checks the input pin D, and sets itself up to remember that input value at its output pin Q. The D-flop is edge-triggered, which means that it responds to the rising edge of the clock pulse. Only the state of the input pin D received at the rising clock edge is captured for output at the output pin Q. Otherwise, the output of the D flip-flop 303 remains in its previous state Qprev. TABLE I, below, is a truth table of the D flip-flop 303.

TABLE I

| Input | | | Out | |
|---|---|---|---|---|
| CLK | D | R | Q | |
| x | x | 1 | 0 | |
| ↑edge | D | 0 | D | |
| non↑ | x | 0 | $Q_{prev}$ | |

The low power oscillator 106 can be used to strobe the reset signal in the period when the reset should be released (i.e., reset should be low). The reset should be released or low when the power cycle circuit 304 indicates that the voltage regulator 301 is in a powered-up state (i.e., SPS=0). In this case, the internal supplies VDDA and VDDD should be equal to or greater than their respective thresholds such that reset=0. However, if the voltage regulator 301 is not operating correctly, the internal supplies VDDA and VDDD may be less than their respective thresholds (i.e., reset=1) even when the power cycle circuit 304 intends that the voltage regulator 301 be in a powered-up state (i.e., SPS=0). Thus, a conflict arises and the output of the D flip-flop 303 goes high due to reset being equal to 1 and SPS being equal to zero. In other words, if a fault occurs and the reset does not toggle low when the chip should wake up, the output terminal Q toggles to 1 and signals an error. This error is signaled as a fault that is output by the wakeup terminal WUout. In this way, a fault in the voltage regulator 301—reset generator 302 chain can be detected and signaled to the output WUout. Other errors detected by the processing circuitry 104, such as those described above including communication errors and internal errors, are also output from the WUout terminal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer, or an electronic circuit. In some embodiments, some one or more of the method steps may be executed by such an apparatus.

It is further to be noted that methods disclosed in the specification or in the claims may be implemented by a device having means for performing each of the respective acts of these methods. Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application-specific integrated circuits (ASICs), field programmable logic arrays (FPGAs), programmable logic controller (PLC), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. A control unit may use electrical signals and digital algorithms to perform its receptive, analytic, and control functions, which may further include corrective functions. Such hardware, software, and firmware may be implemented within the same device or within separate devices to support the various techniques described in this disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a RAM, a ROM, a PROM, an EPROM, an EEPROM, a FLASH memory, or an electronic memory device.

Although various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A battery monitoring system, comprising:
   a sensor device comprising:
      a pressure sensor configured to measure an internal air pressure within a battery enclosure and generate a sensor signal representative of the internal air pressure;
      a first serial peripheral interface (SPI) configured to receive SPI commands;
      a wake-up terminal configured to output fault signals; and
      a first processing circuit coupled to the pressure sensor, the first SPI, and the wake-up terminal,
         wherein the first processing circuit is configurable between a normal running mode and a low power monitoring (LPM) mode, wherein, in the LPM mode, the first processing circuit is configured to alternate between a sampling phase during which the first processing circuit evaluates the sensor signal and a powered-down phase during which the first processing circuit is in a low power state, and
         wherein the first processing circuit is further configured to monitor for at least one SPI communication fault corresponding to information received on the first SPI, generate a communication fault signal in response to detecting the at least one SPI communication fault, and output the communication fault signal from the wake-up terminal.

2. The battery monitoring system of claim 1, wherein, in the LPM mode, the first processing circuit is further configured to monitor for a battery fault based on the sensor signal, generate a battery fault signal in response to detecting the battery fault, and output the battery fault signal from the wake-up terminal.

3. The battery monitoring system of claim 2, wherein the first processing circuit is further configured to monitor for the battery fault during the sampling phase of the LPM mode based on the sensor signal.

4. The battery monitoring system of claim 2, wherein, in the LPM mode, the first processing circuit is further configured to monitor for an internal fault of the sensor device, generate a sensor fault signal in response to detecting the internal fault, and output the sensor fault signal from the wake-up terminal.

5. The battery monitoring system of claim 4, wherein the first processing circuit is further configured to monitor for the internal fault during the sampling phase of the LPM mode.

6. The battery monitoring system of claim 1, wherein, in the LPM mode, the first processing circuit is further configured switch between the sampling phase and the powered-down phase according to a pulse width modulation (PWM) duty cycle such that the first processing circuit periodically wakes-up automatically at regular intervals from the low power state in order to enter into the sampling phase, wherein the sampling phase is defined by a first level of the PWM duty cycle and the powered-down phase is defined by a second level of the PWM duty cycle.

7. The battery monitoring system of claim 1, wherein:
the first SPI includes a chip select terminal configured to receive a chip select signal comprising an active signal level and an idle signal level that define a plurality of chip select frames, wherein a start of each chip select frame is defined by an active signal edge that is a transition from the idle signal level to the active signal level and an end of each chip select frame is defined by an idle signal edge that is a transition from the active signal level to the idle signal level,
each chip select frame is normally a predetermined number of clock cycles in length, and
for each chip select frame, the first processing circuit is further configured to count a number of clock cycles of a chip select frame, compare the counted number of clock cycles to the predetermined number of clock cycles, detect an SPI communication fault on a condition that the counted number of clock cycles deviates from the predetermined number of clock cycles, and generate the communication fault signal to be output from the wake-up terminal.

8. The battery monitoring system of claim 7, wherein the first SPI includes an SPI clock terminal configured to receive an SPI clock signal, and wherein the first processing circuit is further configured to use the SPI clock signal as a basis for counting the number of clock cycles of the chip select frame.

9. The battery monitoring system of claim 1, wherein the sensor device further comprises a memory configured to store a catalog of valid SPI commands,
wherein the first processing circuit is further configured to compare an SPI command received at the SPI with the catalog of valid SPI commands, detect an SPI communication fault on a condition that the SPI command does not match a value SPI command in the catalog of valid SPI commands, and generate the communication fault signal to be output from the wake-up terminal.

10. The battery monitoring system of claim 1, further comprising:
a microcontroller comprising:
a second SPI coupled to the first SPI of the sensor device and configured to transmit the SPI commands thereto;
a digital input terminal coupled to the wake-up terminal of the sensor device for receiving the fault signals; and
a second processing circuit coupled to the second SPI and the digital input terminal,
wherein the second processing circuit is configurable between the normal running mode and the LPM mode,
wherein the second processing circuit is configured to transmit an enter LPM mode SPI command via the second SPI to the sensor device to set the sensor device in the LPM mode, and
wherein, in response to receiving the communication fault signal via the digital input terminal, the second processing circuit is further configured to exit the LPM mode and enter the normal running mode.

11. The battery monitoring system of claim 10, wherein in response to transmitting the enter LPM mode SPI command, the second processing circuit is further configured to enter the LPM mode.

12. The battery monitoring system of claim 10, wherein the microcontroller and the sensor device communicate via the first SPI and the second SPI during the normal running mode.

13. The battery monitoring system of claim 1, wherein the wake-up terminal is separate from the first SPI.

14. A serial peripheral interface (SPI) communication system, comprising:
a sensor device comprising:
a sensor configured to measure a physical quantity and generate a sensor signal;
a first SPI configured to receive SPI commands;
a wake-up terminal configured to output fault signals; and
a first processing circuit coupled to the sensor device, the first SPI, and the wake-up terminal,
wherein the first processing circuit is configurable between a normal running mode and a low power monitoring (LPM) mode, wherein, in the LPM mode, the first processing circuit is configured to alternate between a sampling phase during which the first processing circuit evaluates the sensor signal and a powered-down phase during which the first processing circuit is in a low power state, and
wherein the first processing circuit is further configured to monitor for at least one SPI communication fault corresponding to information received on the first SPI, generate a communication fault signal in response to detecting the at least one SPI communication fault, and output the communication fault signal from the wake-up terminal; and
a microcontroller comprising:
a second SPI coupled to the first SPI of the sensor device and configured to transmit the SPI commands thereto;

a digital input terminal coupled to the wake-up terminal of the sensor device for receiving the fault signals; and a second processing circuit coupled to the second SPI and the digital input terminal, wherein the second processing circuit is configurable between the normal running mode and the LPM mode, wherein the second processing circuit is configured to transmit an enter LPM mode SPI command via the second SPI to the sensor device to set the sensor device in the LPM mode, and wherein, in response to receiving the communication fault signal via the digital input terminal, the second processing circuit is further configured to exit the LPM mode and enter the normal running mode.

15. The SPI communication system of claim 14, wherein the wake-up terminal is separate from the first SPI.

16. A system, comprising:
a sensor device comprising:
a pressure sensor configured to measure an internal air pressure within a battery enclosure and generate a sensor signal representative of the internal air pressure;
a first serial peripheral interface (SPI), configured to receive SPI commands, including chip select terminal configured to receive a chip select signal comprising an active signal level and an idle signal level that define a plurality of chip select frames; and
a first processing circuit configurable between a first mode and a second mode,
wherein, in the second mode, the first processing circuit is configured to alternate between a sampling phase during which the first processing circuit evaluates the sensor signal and a powered-down phase during which the first processing circuit is in a lower power state, and
wherein, in a particular chip select frame of the plurality of chip select frame the first processing circuit is further configured to; count a number of clock cycles of the respective chip select frame, compare the number of clock cycles to a predetermined number of clock cycles of the respective chip select frame, detect an SPI communication fault on a condition that the number of clock cycles deviates from the predetermined number of clock cycles, generate a communication fault signal in response to detecting the one SPI communication fault, and output the communication fault signal.

17. The system of claim 16, wherein, in the second mode, the first processing circuit is further configured to monitor for a battery fault based on the sensor signal, generate a battery fault signal based on detecting the battery fault, and output the battery fault signal.

18. The system of claim 17, wherein the first processing circuit is configured to further monitor for the battery fault during the sampling phase of the second mode based on the sensor signal.

19. The system of claim 17, wherein, in the second mode, the first processing circuit is further configured to monitor for an internal fault of the sensor device, generate a sensor fault signal in response to detecting the internal fault, and output the sensor fault signal.

20. The system of claim 19, wherein the first processing circuit is further configured to monitor for the internal fault during the sampling phase of the second mode.

21. The system of claim 16, wherein, in the second mode, the first processing circuit is further configured switch between the sampling phase and the powered-down phase according to a pulse width modulation (PWM) duty cycle such that the first processing circuit periodically wakes-up automatically at regular intervals from the lower power state in order to enter into the sampling phase, wherein the sampling phase is defined by a first level of the PWM duty cycle and the powered-down phase is defined by a second level of the PWM duty cycle.

22. The system of claim 16, wherein:
wherein a start of the respective chip chip select frame is defined by an active signal edge that is a transition from the idle signal level to the active signal level and an end of each chip select frame is defined by an idle signal edge that is a transition from the active signal level to the idle signal level, each chip select frame is normally a predetermined number of clock cycles in length, and
for each chip select frame, the first processing circuit is further configured to count a number of clock cycles of a chip select frame, compare the counted number of clock cycles to the predetermined number of clock cycles, detect an SPI communication fault on a condition that the counted number of clock cycles deviates from the predetermined number of clock cycles, and generate the communication fault signal.

23. The system of claim 22, wherein the first SPI includes an SPI clock terminal configured to receive an SPI clock signal, and wherein the first processing circuit is further configured to use the SPI clock signal as a basis for counting the number of clock cycles of the chip select frame.

24. The system of claim 16, wherein the sensor device further comprises a memory configured to store a catalog of valid SPI commands,
wherein the first processing circuit is further configured to compare an SPI command received at the SPI with the catalog of valid SPI commands, detect an SPI communication fault on a condition that the SPI command does not match a value SPI command in the catalog of valid SPI commands, and generate the communication fault signal.

25. The system of claim 16, further comprising:
a microcontroller comprising:
a second SPI coupled to the first SPI of the sensor device and configured to transmit the SPI commands thereto; and
a second processing circuit configurable between the first mode and the second mode,
wherein the second processing circuit is configured to transmit an enter second mode SPI command via the second SPI to the sensor device to set the sensor device in the second mode, and
wherein, in response to receiving the communication fault signal, the second processing circuit is further configured to exit the second mode and enter the first mode.

26. The system of claim 25, wherein in response to transmitting the enter second mode SPI command, the second processing circuit is further configured to enter the second mode.

* * * * *